United States Patent
Ungar

(10) Patent No.: US 7,103,080 B2
(45) Date of Patent: Sep. 5, 2006

(54) LASER DIODE WITH A LOW ABSORPTION DIODE JUNCTION

(75) Inventor: Jeffrey E. Ungar, Valley Village, CA (US)

(73) Assignee: Quintessence Photonics Corp., Sylmar, CA (US)

(*) Notice: Subject to any disclaimer, the term of this patent is extended or adjusted under 35 U.S.C. 154(b) by 189 days.

(21) Appl. No.: 10/378,723

(22) Filed: Mar. 3, 2003

(65) Prior Publication Data
US 2004/0013146 A1 Jan. 22, 2004

Related U.S. Application Data

(60) Provisional application No. 60/361,785, filed on Mar. 4, 2002.

(51) Int. Cl.
*H01S 5/20* (2006.01)

(52) U.S. Cl. .............................. 372/45.01; 372/44.01

(58) Field of Classification Search ............ 372/43–46, 372/46.01
See application file for complete search history.

(56) References Cited

U.S. PATENT DOCUMENTS

| | | | |
|---|---|---|---|
| 5,311,533 A | 5/1994 | Stutius et al. | |
| 5,442,204 A | 8/1995 | Mensz | |
| 5,751,754 A | 5/1998 | Takagi | |
| 5,936,266 A | 8/1999 | Holonyak, Jr. et al. | |
| 6,304,587 B1 | 10/2001 | Zah | |
| 6,526,082 B1 * | 2/2003 | Corzine et al. | 372/46.01 |
| 6,839,370 B1 * | 1/2005 | Peters et al. | 372/46 |
| 2002/0027935 A1 | 3/2002 | Anayama | |

FOREIGN PATENT DOCUMENTS

DE 197 03 612 A1 * 8/1998

OTHER PUBLICATIONS

Sugg A R et al: "n-p-(p$^+$-n$^+$)-n Al$_y$Ga$_{1-y}$As-GaAs-In$_x$Ga$_{1-x}$As quantum-well laser with p$^+$-n$^+$ GaAs-InGaAs tunnel contact on n-GaAs", Applied Physics Letters, American Institute of Physics, NY, vol. 62, No. 20, May 17, 1993, p. 2510-2512.

* cited by examiner

*Primary Examiner*—James Menefee
(74) *Attorney, Agent, or Firm*—Ben J. Yorks; Irell & Manella, LLP

(57) ABSTRACT

A laser diode that has a pluality of semiconductor epitaxial layers grown on a substrate. The diode includes a light generating layer located between two layers of n-type material. A thin layer of p-type material is interposed between the active layer and an n-type layer. The diode includes a layer of n-doped material located adjacent to a substrate. The laser diode further includes an active layer located between the n-doped layer and a layer of p-doped material. An additional layer of n-doped material is located between the p-doped material and a contact. The contact is biased so as to induce a recombination of holes and electrons in the active region and generate light. The light travels along the active layer, p-doped layer and in both n-doped layers. Having an n-doped layer between the contact and p-doped layer reduces the amount of photon absorption within the laser diode.

7 Claims, 2 Drawing Sheets

LASER DIODE WITH A LOW ABSORPTION DIODE JUNCTION

REFERENCE TO CROSS RELATED APPLICATION

This application claims priority under 35 U.S.C §119(e) to provisional Application No. 60/361,785 filed on Mar. 4, 2002.

BACKGROUND OF THE INVENTION

1. Field of the Invention

The subject matter disclosed generally relates to the field of laser diodes.

2. Background Information

Laser diodes are used in a variety of system applications. For example, laser diodes are used as a light source in fiber optic communication systems. It is generally desirable to increase the output power and energy efficiency of a laser diode.

FIG. 1 shows an exemplary construction of a laser diode 1. The laser diode 1 includes a layer of n-doped material 2 and a layer of p-doped material 3 that are separated by an active layer 4. The n-doped and p-doped layers create a diode junction. A current is injected into the laser diode 1 through a contact 5. The current induces a migration of electrons and holes from the n-doped 2 and p-doped 3 layers into the active layer 4. The holes and electrons recombine to create a stimulated emission of photons. The laser diode 1 may also have upper 6 and lower 7 cladding layers that create a waveguide for the light generated in the active layer 4.

Unfortunately, the p-doped layers of most laser diodes have a high optical absorption coefficient. The high absorption rate of light in the p-doped layers reduces the energy efficiency of the laser diode. The lower efficiency increases the current requirements. Higher current increases the heat generated within the laser diode and reduces the life of the device. P-doped layers also have higher electrical resistivity than n-doped layers, which further reduces the electrical-to-optical conversion efficiency.

BRIEF SUMMARY OF THE INVENTION

A laser diode that includes an active layer located between a layer of p-doped material and a layer of n-doped material. The n-doped material is adjacent to a substrate. The laser diode further has a contact. Located between the p-doped material and the contact is another layer of n-doped material.

DETAILED DESCRIPTION

Disclosed is a laser diode that has a pluality of semiconductor epitaxial layers grown on a substrate. The diode includes a light generating layer located between two layers of n-type material. A thin layer of p-type material is interposed between the active layer and an n-type layer. The diode includes a layer of n-doped material located adjacent to a substrate. The laser diode further includes an active layer located between the n-doped layer and a layer of p-doped material. An additional layer of n-doped material is located between the p-doped material and a contact. The contact is biased so as to induce a recombination of holes and electrons in the active region and generate light. The light travels along the active layer, p-doped layer and in both n-doped layers. Having an n-doped layer between the contact and p-doped layer reduces the amount of photon absorption within the laser diode.

Figure 1:
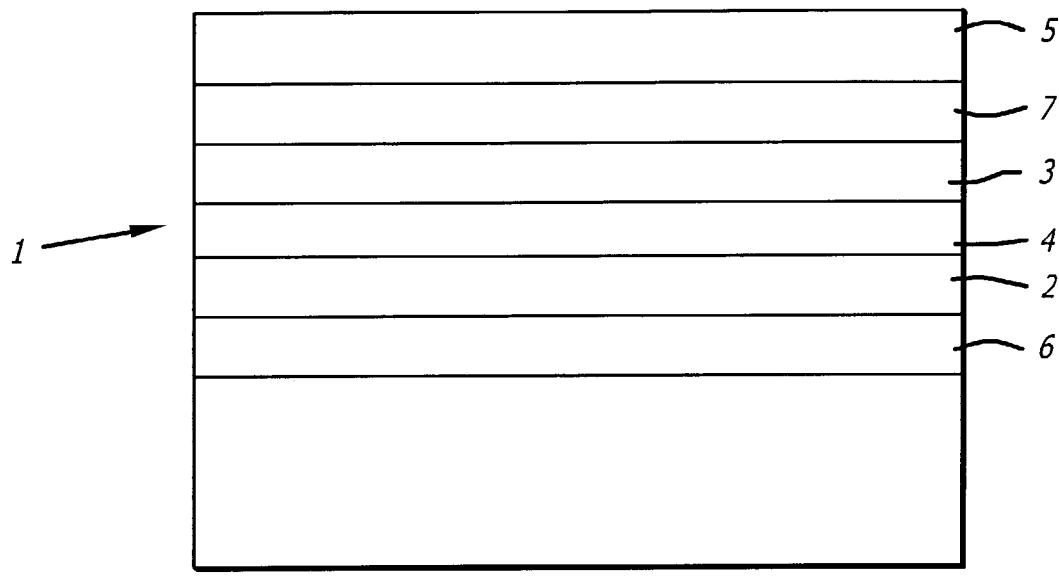
FIG. 1 is an illustration showing various layers of a laser diode in the prior art.
Figure 2:
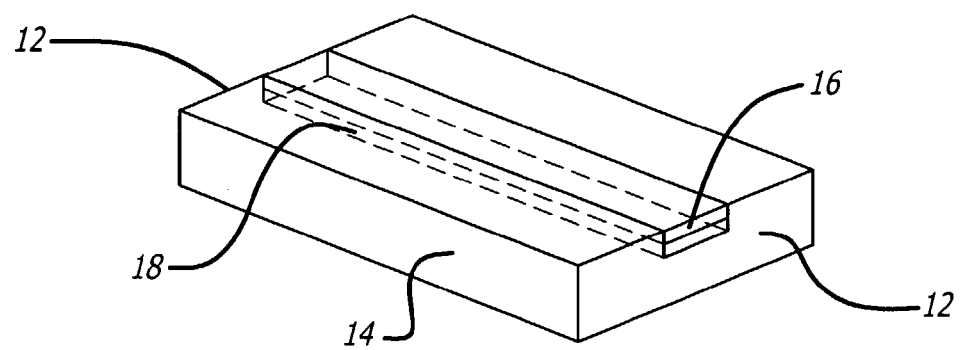
FIG. 2 is an illustration of a laser diode.

Referring to the drawings more particularly by reference numbers, FIG. 2 shows an example of an embodiment of a laser diode 10. The embodiment shown in FIG. 2 is merely exemplary, it is to be understood that the laser diode 10 may have other combinations or structures. The laser diode 10 may include a pair of partially reflective mirrors 12 formed on the ends of a semiconductor substrate 14. The laser diode 10 may further include a P-N junction 16 and an optical waveguide 18. The embodiment shown in FIG. 2 is referred to as a Fabry-Perot laser diode. Although a Fabry-Perot laser diode is shown and described, it is to be understood that other types of laser diodes may be employed.

Figure 3:
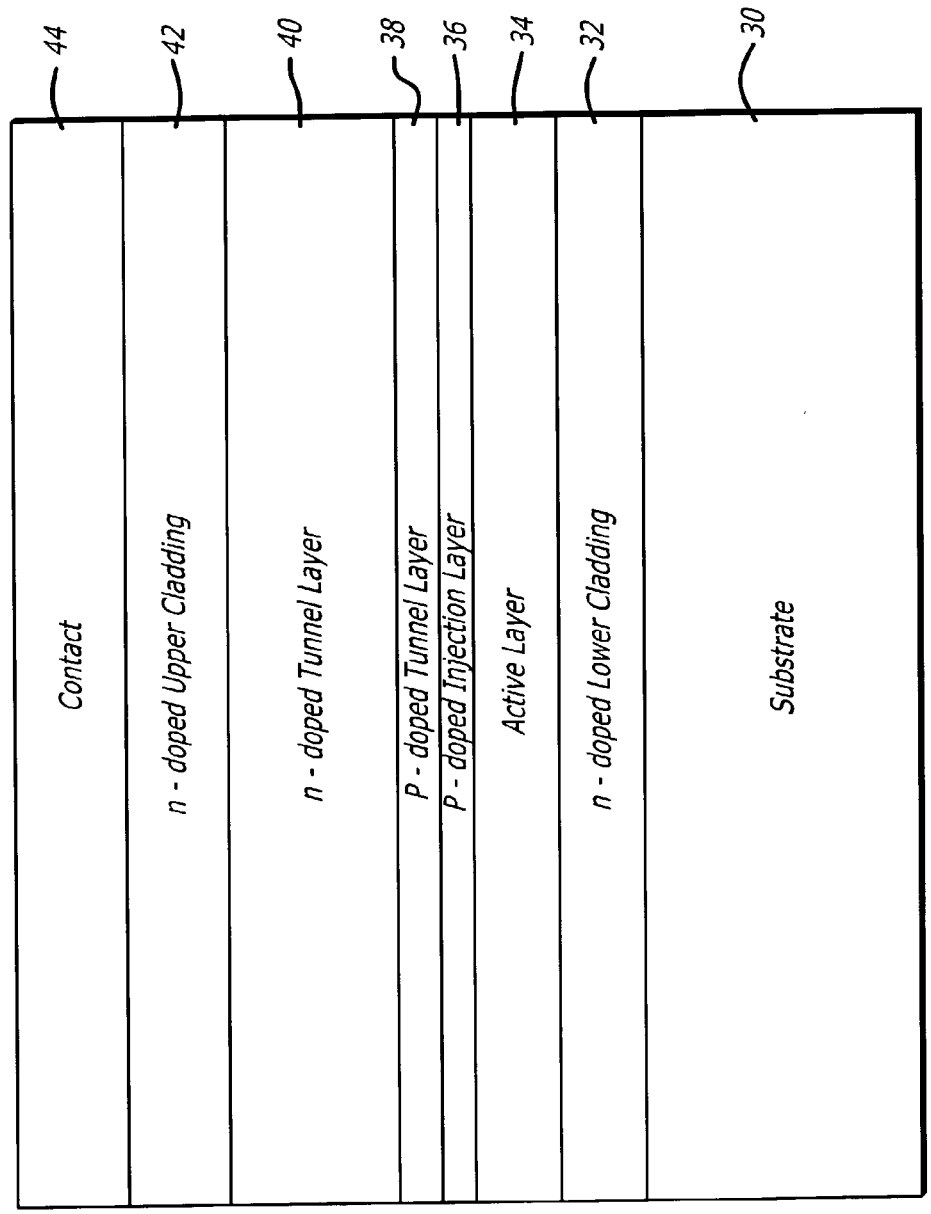
FIG. 3 is an illustration showing various layers of a laser diode.
Figure 3:
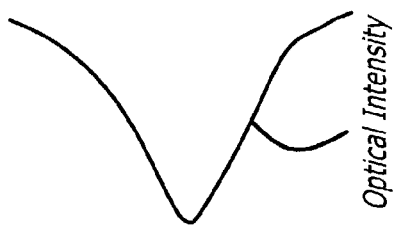

FIG. 3 shows the different layers 30, 32, 34, 36, 38, 40, 42 and 44 of an embodiment of the laser diode 10. The layers 30, 32, 34, 36, 38, 40, 42 and 44 may be constructed from conventional gallium aluminum arsenide or indium gallium arsenide phosphide alloys known in the art. Although GaAs and InP based materials are described, it is to be understood that other materials may be used and the embodiment described is merely exemplary.

The laser 10 may include a lower cladding 32 formed on a substrate 30. The substrate 30 may be an n-doped material. The lower cladding 32 may be an n-doped InGaAsP or $Al_yGa_{1-y}As$ or similar semiconductor. A multi-quantum well active layer 34 may be located adjacent to the n-doped lower cladding layer 32.

The laser diode 10 may have an injection layer 36 located adjacent to the active layer 34. The injection layer 36 may be a heavily p-doped InGaAsP or $Al_yGa_{1-y}As$ material. A tunnel layer 38 of heavily p-doped material may be located adjacent to the injection layer 36. By way of example, layer 38 may be p-doped InGaAsP or $Al_xGa_{1-x}As$ material.

A tunnel layer of heavily n-doped material 40 may be located adjacent to the p-doped tunnel layer 38. The tunnel layer 40 may be n-doped InGaAsP or $Al_zGa_{1-z}As$ material. An upper cladding layer 42 may be located adjacent to the n-doped tunnel layer 40. The upper cladding layer 42 may be lightly n-doped InP or $Al_xGa_{1-x}As$ material. A contact 44 may be located adjacent to the upper cladding layer 42. The contact 44 may be an electrical contact layer containing heavily n-doped InGaAs or GaAs material.

The laser diode 10 can be constructed by initially forming layers 32, 34 and 36 on the substrate 30. The remaining layers 38, 40, 42 and 44 can then be sequentially formed onto layer 38. All the layers can be formed with known epitaxial semiconductor fabrication processes. This process is merely exemplary, it is to be understood that the diode 10 can be formed using different, alternate, etc. steps and processes.

In operation, the contact 44 is forward biased to inject current into the laser diode 10. The junction between the n-doped layer 32 and the p-doped layer 36 becomes forward biased, the junction between the p-doped tunnel layer 38 and the n-doped tunnel layer 40 become reverse biased. The high field and narrow depletion width of the diode junction at the p-doped layer 38 and n-doped layer 40 allow tunnel current to flow through even though the junction is reverse biased.

The current flow can be further enhanced by suitable doping of the layers 38 and 40 to create an avalanche effect.

The forward biasing of the n-doped layer 32/p-doped layer 36 diode junction and the resulting flow of current allow for recombination of holes and electrons in the active region 34. The recombination of holes and electrons creates a stimulated emission of photons.

The laser diode 10 creates a light beam with an optical profile shown in FIG. 3. A portion of the light travels along the p-doped and n-doped layers 32, 34, 36, 38 and 40. In laser diodes of the prior art the layers above the active region 34 are constructed with p-doped materials that are highly absorptive of light. Providing a laser diode with n-doped layers 40 and 42 reduces photon absorption and increases the energy efficiency required to convert current into photons. The increase in energy efficiency lowers the current requirements of the laser diode. Lower current reduces the heat generated within the laser diode 10 and the improves the life of the device. N-doped layers also have lower resistivity than similar doped p-doped layers; the series operating voltage is therefore reduced, and conversion efficiency enhanced. The tunnel layers 38 and 40 allow for current to flow even in the presence of n-doped material in the top half of the laser diode 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An edge emitting laser diode, comprising:
   a substrate;
   a first layer of n-doped cladding material adjacent to said substrate;
   an active layer adjacent to said layer of n-doped material;
   a first layer of p-doped material adjacent to said active layer;
   a second layer of n-doped material adjacent to said first layer of p-doped material, said second layer of n-doped material includes a heavily n-doped tunnel layer and an upper cladding layer; and,
   a contact adjacent to said second layer of n-doped material, said contact is biased so that light is generated in said active layer, the light travels along said active layer, said first layer of p-doped material and said heavily n-doped tunnel layer.

2. The laser diode of claim 1, wherein said first layer of p-doped material includes a lightly p-doped injection layer and heavily p-doped tunnel layer.

3. The laser diode of claim 1, wherein said contact is n-doped.

4. An edge emitting laser diode, comprising:
   a substrate;
   a lower cladding layer of n-doped material adjacent to said substrate;
   an active layer adjacent to said lower cladding layer of n-doped material;
   an injection layer of lightly p-doped material adjacent to said active layer;
   a tunnel layer of heavily p-doped material adjacent to said injection layer of lightly p-doped material;
   a tunnel layer of heavily n-doped material adjacent to said tunnel layer of heavily p-doped material;
   an upper cladding layer of n-doped material adjacent to said tunnel layer of heavily n-doped material; and,
   a contact adjacent to said upper cladding layer of n-doped material, said contact is biased so that light is generated in said active layer, the light travels along said active layer, said injection layer and said tunnel layers of heavily n-doped and p-doped material.

5. The laser diode of claim 4, wherein said contact is n-doped.

6. A method for operating an edge emitting laser diode, comprising:
   providing a first layer of n-doped cladding material over a substrate;
   providing an active layer over the first layer of n-doped material;
   providing a first layer of p-doped material over the active layer;
   providing a second layer of n-doped material over the first layer of p-doped material, the second layer including a heavily n-doped tunnel layer and an upper cladding layer;
   providing a contact over the second layer of n-doped material; and,
   biasing the contact to generate light in the active layer, the light travels along the active layer, the first layer of p-doped material and the heavily n-doped tunnel layer.

7. A method for operating an edge emitting laser diode, comprising:
   providing a lower cladding layer of n-doped material over a substrate;
   providing an active layer over the lower cladding layer of n-doped material;
   providing an injection layer of lightly p-doped material over the active layer;
   providing a tunnel layer of heavily p-doped material over the injection layer of lightly p-doped material;
   providing a tunnel layer of heavily n-doped material over the tunnel layer of heavily p-doped material;
   providing an upper cladding layer of n-doped material over the tunnel layer of n-doped material;
   providing a contact over the upper cladding layer of n-doped material; and,
   biasing the contact to generate light in the active layer, the light travels along the active layer, the injection layer and the tunnel layers of heavily n-doped and p-doped materials.

* * * * *